(12) United States Patent  (10) Patent No.: US 7,699,180 B2
Mollard et al.  (45) Date of Patent: Apr. 20, 2010

(54) COMPUTER RACK AND TRANSPORT PALLET METHOD FOR PACKAGING A COMPUTER RACK

(75) Inventors: Emmanuel Mollard, Nanterre (FR); Lionel Coutancier, Croisilles (FR)

(73) Assignee: Bull S.A.S., Rue Jean Jaures (FR)

( * ) Notice: Subject to any disclaimer, the term of this patent is extended or adjusted under 35 U.S.C. 154(b) by 39 days.

(21) Appl. No.: 12/068,304

(22) Filed: Feb. 5, 2008

(65) Prior Publication Data

US 2008/0156758 A1 Jul. 3, 2008

Related U.S. Application Data

(63) Continuation of application No. 11/366,819, filed on Mar. 3, 2006, now abandoned.

(51) Int. Cl.
*A47F 7/00* (2006.01)

(52) U.S. Cl. ....................................................... 211/26

(58) Field of Classification Search ................ 206/423, 206/710; 211/26, 151; 312/257; 361/829, 361/600, 679; 280/28.5; 108/57.17, 54.1, 108/55.3
See application file for complete search history.

(56) References Cited

U.S. PATENT DOCUMENTS

| | | | | | |
|---|---|---|---|---|---|
| 4,155,462 | A | * | 5/1979 | Bendel | 211/151 |
| 4,347,794 | A | * | 9/1982 | Nordstrom | 108/57.15 |
| 4,911,084 | A | * | 3/1990 | Sato et al. | 108/57.17 |
| 5,137,159 | A | * | 8/1992 | Collins et al. | 211/151 |
| 5,230,552 | A | * | 7/1993 | Schipper et al. | 312/223.6 |
| 5,443,017 | A | * | 8/1995 | Wacker et al. | 108/3 |
| 5,499,547 | A | * | 3/1996 | Nagai et al. | 74/89.34 |
| 5,644,991 | A | * | 7/1997 | Prevot et al. | 108/54.1 |
| 5,761,960 | A | * | 6/1998 | Nagai et al. | 74/89.33 |
| 5,802,988 | A | * | 9/1998 | Shields | 108/147 |
| 5,842,424 | A | * | 12/1998 | Prevot et al. | 108/54.1 |
| 6,027,190 | A | * | 2/2000 | Stewart et al. | 312/201 |
| 6,126,131 | A | * | 10/2000 | Tietz | 248/346.01 |
| 6,135,549 | A | * | 10/2000 | Demick et al. | 297/188.1 |
| 6,360,676 | B1 | * | 3/2002 | Schepers | 108/52.1 |
| 6,526,702 | B2 | * | 3/2003 | Jones | 52/64 |
| 6,669,314 | B1 | * | 12/2003 | Nemec et al. | 312/201 |
| 6,688,708 | B1 | * | 2/2004 | Janson | 312/200 |
| 6,769,368 | B2 | * | 8/2004 | Underbrink et al. | 108/55.3 |
| 6,842,665 | B2 | * | 1/2005 | Karlen | 700/217 |
| 6,843,180 | B1 | * | 1/2005 | Keaton | 104/248 |
| 6,955,464 | B1 | * | 10/2005 | Tybinkowski et al. | 378/209 |
| 7,201,243 | B2 | * | 4/2007 | Konstant | 180/20 |
| 7,219,609 | B1 | * | 5/2007 | Utz et al. | 108/57.21 |

(Continued)

*Primary Examiner*—Sarah Purol
(74) *Attorney, Agent, or Firm*—Miles & Stockbridge P.C.; Eric G. King

(57) ABSTRACT

A layout for packaging a computer rack comprises a transport pallet (2) and a computer rack; the computer rack being associable with casters extending vertically by a first distance relatively to a lower face of the rack. The computer rack is made integral with the pallet by two anchoring means distributed on the underside of the rack on either side of a vertical median plane (P1); the pallet includes two side modules and an intermediate supporting means separable from the remainder of the pallet and allowing the side modules to be connected. The side modules are removably attached to the anchoring means, so as to ensure that the computer rack is maintained in a horizontal position, and that the pallet is spaced away from the underside of the rack by a second distance (H2) smaller than said first distance.

10 Claims, 5 Drawing Sheets

U.S. PATENT DOCUMENTS

| | | |
|---|---|---|
| 7,484,631 B2 * | 2/2009 | Bothun et al. ............... 211/162 |
| 2002/0182035 A1 * | 12/2002 | Karlen ..................... 414/143.2 |
| 2003/0097967 A1 * | 5/2003 | Underbrink et al. ........ 108/55.1 |
| 2005/0237184 A1 * | 10/2005 | Muirhead .............. 340/539.13 |
| 2005/0241548 A1 * | 11/2005 | Muirhead .................. 108/51.3 |
| 2005/0241549 A1 * | 11/2005 | Gordon ..................... 108/51.3 |
| 2006/0048686 A1 * | 3/2006 | Watanabe et al. ........ 108/51.11 |
| 2006/0102574 A1 * | 5/2006 | Konstant .................... 211/151 |
| 2006/0243174 A1 * | 11/2006 | Muirhead .................. 108/51.3 |
| 2006/0266828 A1 * | 11/2006 | Silverbrook et al. ........ 235/385 |
| 2007/0137531 A1 * | 6/2007 | Muirhead .................. 108/51.3 |
| 2007/0163472 A1 * | 7/2007 | Muirhead .................. 108/51.3 |
| 2008/0156758 A1 * | 7/2008 | Mollard et al. .............. 211/151 |
| 2008/0228316 A1 * | 9/2008 | Stevens et al. .............. 700/217 |
| 2008/0295743 A1 * | 12/2008 | Beam et al. .............. 108/50.02 |
| 2009/0078172 A1 * | 3/2009 | Kaufmann et al. ....... 108/57.17 |

* cited by examiner

COMPUTER RACK AND TRANSPORT PALLET METHOD FOR PACKAGING A COMPUTER RACK

CROSS-REFERENCE TO RELATED APPLICATIONS

This application is a continuation of U.S. patent application Ser. No. 11/366,819, filed Mar. 3, 2006 now abandoned.

BACKGROUND OF THE INVENTION

1. Field of the Invention

The present invention relates to the field of high density type computer racks of data centers, network rooms and wiring cabinets. The invention more particularly concerns a layout and a packaging method used in the palletization and depalletization of a computer rack. A computer rack and a transport pallet specific to this original layout are also the object of the present invention.

2. Description of Related Art

In existing conventional methods, the computer rack is brought via its casters onto the upper platform of the pallet through a loading ramp integral with the pallets or added to the latter. The rack is then delivered to the client and then depalletized on site with the same method.

Although presently, these systems are easy to apply, they have a few limits all the same. The depalletization procedure which consists of lowering the rack from its pallet reveals a few deficiencies relating to the safety of the operators but also to the protection of the hardware. Two or even three operators are required for ensuring the lowering of a rack from its pallet. Indeed, the latter may weigh up to 1,200 kg and its dimensions do not allow it to be handled by a single person.

Unexpected phenomena, related to dynamics, may cause falling of the rack. Just to mention a few of them: unstable ramps, a rack which moves diagonally, and leaves its course, a rack which starts to accelerate because it is difficult to hold back because of its mass and its dimensions.

It should also be noted that the height of the palletized and packed rack assembly is limited by the passage height under the upper frame of the doors. So this therefore restricts the useful height of the rack when the trend is to try to maximize it. This useful height is generally expressed in the total number of units U from the EIA-31 0-0 standard, this unit allowing localization and vertical positioning of the computer equipment in a rack [1 U=44.45 mm].

Concretely, because of a door height limited to about 2 meters, a rack, the useful height of which is larger than 36 U, cannot be brought into the operating room with its pallet and its packaging. The latter pallet is generally depalletized outside the buildings. Several drawbacks then appear: the hardware is unpacked regardless of the weather (rain, wind, snow . . . ) and especially before it has reached the room temperature of the receiving room; the rack (maximum 1,200 kg) after depalletization is transported (by using its own carters) up to the room with certain difficulties due to the nature of the flooring and the declivity of the ground. These difficulties are reduced with the use of a handling truck which is much more flexible in use.

However, the use of a truck inside buildings does not allow the use of computer racks with a large height.

SUMMARY OF THE INVENTION

The object of the present invention is to overcome one or more drawbacks of the prior art, by proposing an efficient packaging layout advantageously adapted for transport, while allowing the actual rack height to be maximized.

For this purpose, the invention concerns a layout for packaging a computer rack of the transportable type, by means of a lifting device, such as, for example, a pallet transfer unit such as a fork lift which may be hydraulically operated. The invention comprises a transport pallet and a computer rack, the computer rack being determined relatively to at least one lower face of the computer rack, characterized in that the computer rack is made integral with the transport pallet by two means for anchoring the computer rack, distributed under the lower face of the computer rack, on either side of a vertical median plane, said pallet including two side modules and at least one intermediate supporting means of the type separable from the remainder of the pallet and with which side modules may be connected, a first of the side modules of the pallet including means for removably attaching the first anchoring means and a second of the side modules of the pallet including means for removably attaching the second anchoring means, the means for attaching the side modules and said anchoring means are laid out facing each other so as to maintain the lower face of the computer rack in a horizontal position, so that the tope of the pallet is spaced away from the lower face of the computer rack by a second determined distance strictly smaller than said first determined distance.

Hence, advantageously, the invention proposes a specific pallet type and rack type, allowing a gain in useful height of the computer rack, while minimizing the space between the transport pallet and the lower face of the computer rack. The invention enables the extra height related to the casters of the computer rack to be suppressed and proposes the use of a transport pallet with separable modules which facilitate the depalletization operation. The computer rack may actually be held higher by a lifting device and easily detached from the modules of the pallet.

According to a feature of the invention, the layout includes at least two removable devices with casters each provided with a cooperative member provided for attachment to one of the anchoring means of the computer rack.

According to a feature, the anchoring means under the computer rack comprise respective slides, the slides including horizontal rails, both side modules each comprising an upper surface fitted with at least one plate parallel to said upper surface, a plate under which are formed grooves or channels adjacent to said upper surface in order to receive the end of a rail of the slides.

According to a feature, the plates of the side modules are in direct contact with the lower face of the computer rack.

According to a feature, the anchoring means comprise parallel slides adapted so as to interchangeably receive either the side modules of the transport pallet, or removable devices with casters.

Thus, the computer rack detached from its pallet and held higher by a handling device may easily receive the caster devices which are substituted for side modules of the pallet.

According to another particularity, the removable caster devices are each provided with at least two casters and with at least two vertically adjustable ground-positioning jacks.

According to another particularity, the intermediate supporting means and the side modules of the pallet each include a lower face so as to form the top of the pallet in a same horizontal plane, said intermediate supporting means further comprising at least one bracket formed on its upper face for supporting said lower face of the computer rack.

According to another particularity, the second determined distance is between 0.4 and 4 cm.

Thus, the height loss immediately below the computer rack is reduced considerably.

According to another particularity, the pallet includes means for locking the rack in position, distributed over each of the side modules.

According to another particularity, said intermediate supporting means is of a smaller thickness relatively to the thickness of the side modules, so as to leave a gap between the lowest level of the pallet and the lowest portion of the intermediate supporting means, this gap facilitating separation of the intermediate supporting means from the remainder of the pallet.

Another object of the invention is to propose a computer rack structure with which transport difficulties may be minimized and close cooperation with a transport pallet may be achieved.

For this purpose, the invention concerns a computer rack of the type associable with casters positioned under at least one lower face of the computer rack and specifically adapted so as to form with a transport pallet, the layout according to the invention, characterized in that it includes:

at least two removable caster devices; and two anchoring means distributed under the lower face of the computer rack, on either side of a vertical median plane, the anchoring means comprising respective parallel slides both adapted for interchangeably receiving the removable caster devices and removable attachment means of a transport pallet, so as to minimize the gap under the computer rack during palletization of the latter by removing the removable caster devices.

According to another particularity, the slides consist of two sets of horizontal guiding rails connected to the lower face of the computer rack, the first set of rails being positioned at a front end of the computer rack, and the second set of rails being positioned at a rear end of the computer rack, the slides each comprising at least one housing delimited by the rails and the lower face of the computer rack for translationally receiving a corresponding attachment means.

According to another particularity, each of the slides comprises a stop member for marking an end of travel of the attachment means received in the slide.

Another object of the invention is to propose a transport pallet closely cooperating with a computer rack and with which transport difficulties may be minimized.

For this purpose, the invention concerns a transport pallet specifically adapted so as to form the layout according to the invention with a computer rack, characterized in that it includes:

two side modules each including an upper face on which are mounted attachment means of the type including at least one translationally sliding member so as to mechanically cooperate with a corresponding means mounted under a computer rack, so as to make the computer rack integral with the pallet; and at least one intermediate supporting means of the type separable from the remainder of the pallet and comprising respective fastening members for connecting the side modules.

Thus, the pallet with separable modules according to the invention, advantageously allows gradual depalletization of the computer rack.

According to another particularity, both side modules each include an upper surface fitted with at least one plate parallel to said upper surface, a plate under which are formed grooves or channels adjacent to said upper surface.

According to another particularity, the intermediate supporting means and the side modules of the pallet each include an upper face for forming the top of the pallet in a same horizontal plane, said intermediate supporting means comprising at least one bracket formed on its upper face in order to support the lower face of a computer rack, said intermediate supporting means being of a smaller thickness relatively to the thickness of the side modules, so as to leave a gap between the lowest level of the pallet and the lowest portion of the intermediate supporting means, this gap facilitating separation of the intermediate supporting means from the remainder of the pallet.

Another object of the invention concerns a method for packaging a computer rack by means of a transport pallet which allows the useful height of the computer rack to be maximized while facilitating the transport and the setting up of the computer rack.

For this purpose, the invention proposes a computer rack packaging method for its transport, the computer rack being of the type associable with casters extending vertically by a first determined distance relatively to at least one lower face of the computer rack, characterized in that it is applied via a transport pallet including at least two side modules and an intermediate supporting means of the separable type with which the side modules may be connected, the method including:

a step for providing two distinct anchoring means mounted so as to be integral with the computer rack, distributed below the lower face of the computer rack, on either side of a vertical median plane;

a palletization step including horizontal translation so as to position said pallet under the computer rack, parallel to said median plane, and an attachment step achieved during the horizontal translation including the attachment of a first of the pallet's side modules to a first of the anchoring means on the one hand, and the attachment of a second of the side modules of the pallet to a second of the anchoring means on the other hand, so that the top of the pallet is spaced away from the lower face of the computer rack by a second determined distance strictly smaller than said first determined distance.

According to another particularity, the first attachment step comprises insertion of plates in respective slides forming the anchoring means under the computer rack, the plates being distributed over each of the side modules.

According to another particularity, the method comprises a step for removing said intermediate supporting means, including detachment of the respective side modules of this intermediate supporting means and substantially horizontal translational displacement of the intermediate supporting means so as to leave an empty space between the side modules.

According to another particularity, the step for removing the intermediate supporting means is followed by a step for lifting the assembly formed by the rack and the remainder of the pallet attached to the computer rack and by a step for removing the respective side modules by horizontal translation in order to replace them with removable caster devices which attach to the anchoring means of the computer rack along with a horizontal translational movement.

BRIEF DESCRIPTION OF THE DRAWINGS

The invention, with its features and advantages, will become more clearly apparent upon reading the description made with reference to the appended drawings wherein.

DETAILED DESCRIPTION

In all of the following, a computer rack means any structure of the high density type with hardware which may be used in data centres, network rooms or wiring cabinets.

In order to maximize the useful height of a rack for which the overall height on pallet and as packed should not exceed 2 m, the packaging layout according to the invention should allow close physical cooperation between the top of the pallet and the lower face of the computer rack. Indeed, the rack, the mass of which may attain 1.2 metric tons should be able be displaced with a pallet transfer lifting device (50) which may be, for example, a hand operated hydraulic for lift or the like and pass under a door for which the standard height is 2 m.

Figure 1:
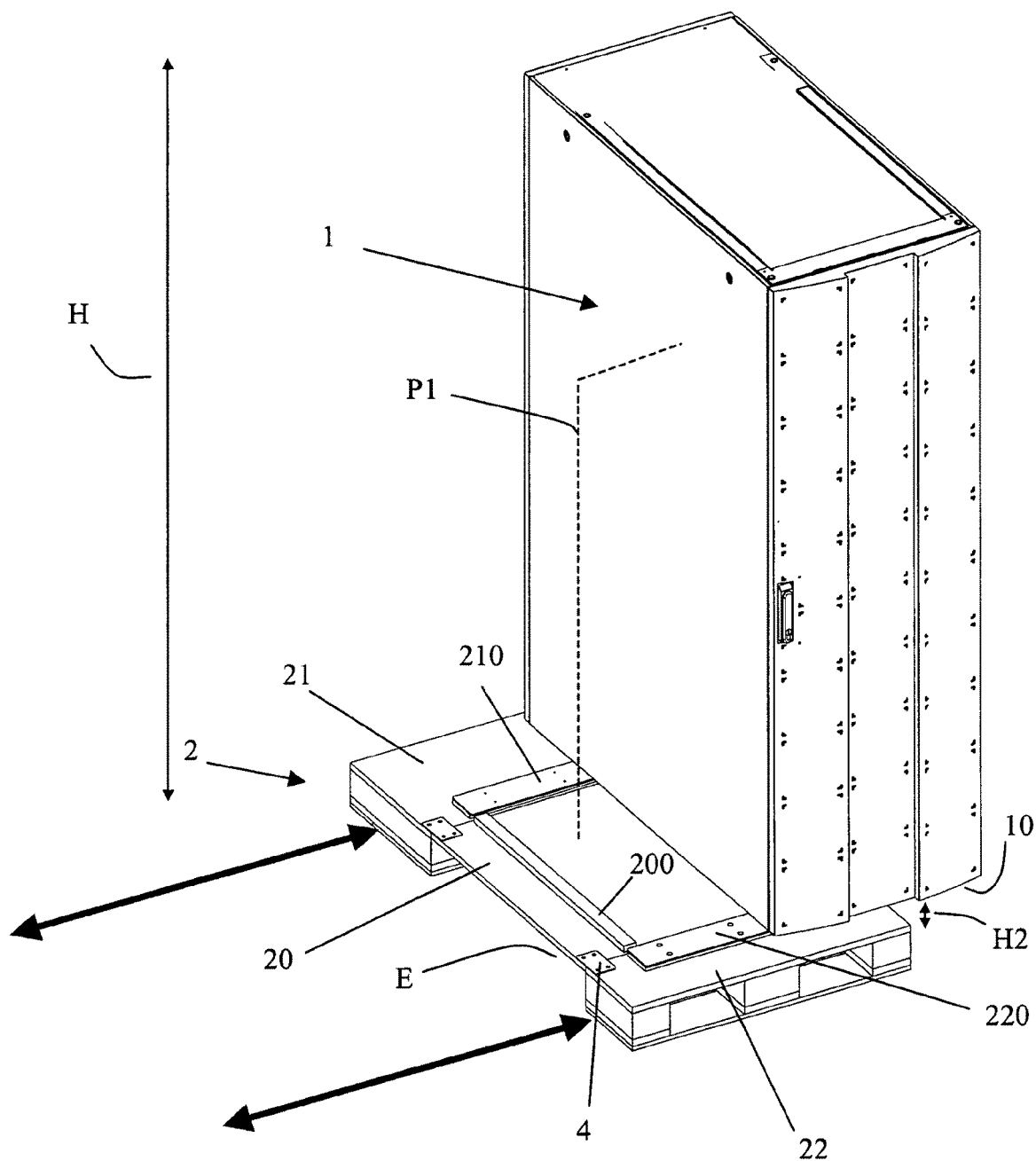
FIG. 1 represents a perspective view illustrating the sliding of a pallet according to the invention under a computer rack provided with anchoring means.
Figure 2:
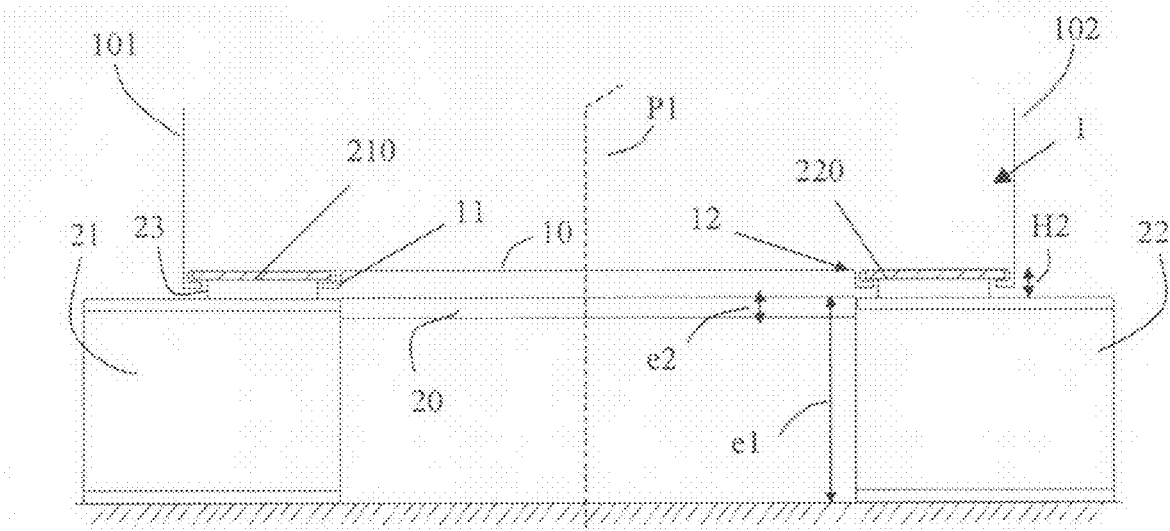
FIG. 2 represents a transverse sectional view relatively to the median plane P1 of FIG. 1 illustrating the cooperation of the rack with the pallet according to the invention.

In the embodiment shown in FIGS. 1 and 2, the computer rack is brought without its casters onto a transport pallet (2) formed with several pieces. This is achieved prior to delivery of the rack, during a packaging phase. The rack (1) may thus be palletized without the casters (31) being initially attached under the computer rack (1), provided that it is possible to easily attach the casters (31) associated with this rack (1) subsequently.

It is therefore important to facilitate the phase consisting of detaching the rack from its pallet and attaching the wheels. For this, a lifting truck (a highly used common tool of the transpallet type) should be used for lifting the rack (1) and removing the pallet (2). We note that at this specific moment, for conventional arrangements it is difficult both to lift the rack (1) by having a lifting truck pass through the pallet (2) and to remove the latter. To solve this, the packaging method according to the invention provides the use of an original pallet (2) in at least three separable pieces. All these pieces are connected together by a mechanical system which can be dismantled and then detached so as to make the lifting of the rack (1) and the removal of the pallet (2), independent.

With reference to FIG. 1, the pallet for example comprises two side modules (21, 22) and at least one intermediate supporting means (20) of the type separable from the remainder of the pallet and allowing the side modules to be connected (21, 22). The side modules (21, 22) are separated from each other by the intermediate supporting means (20) and distributed on either side of a vertical median plane (P1). In a preferred embodiment of the invention, the intermediate supporting means has a surface area corresponding to more than one third of the surface area of the pallet (2), the side modules for example each forming less than one third of the surface area of the pallet (2).

Close cooperation between the computer rack (1) and the pallet (2) corresponds to a packaging layout allowing the rack (1) to be transported by means of the lifting truck or any lifting device (50) of this type. As illustrated in FIG. 2, the computer rack (1) may be of a conventional parallelepipedous shape, and associated with casters (31) extending vertically by a first determined distance (H1) relatively to at least one lower face (10) of this rack (1). The computer rack (1) is made integral with the transport pallet (2) by two anchoring means (12) distributed under the lower face (10) of the computer rack, on either side of the vertical median plane (P1). The side modules (21, 22) of the pallet (12) each includes means (210, 220, 23) laid out so as to be removably fixed to the respective anchoring means (12) of the computer rack (1). These attachment means (210, 220, 23) and the anchoring means (12) are positioned facing each other so as to provide close cooperation between pallet (2) and rack (1) and to maintain the lower face (10) of the computer rack (1) in an horizontal position.

Figure 5:
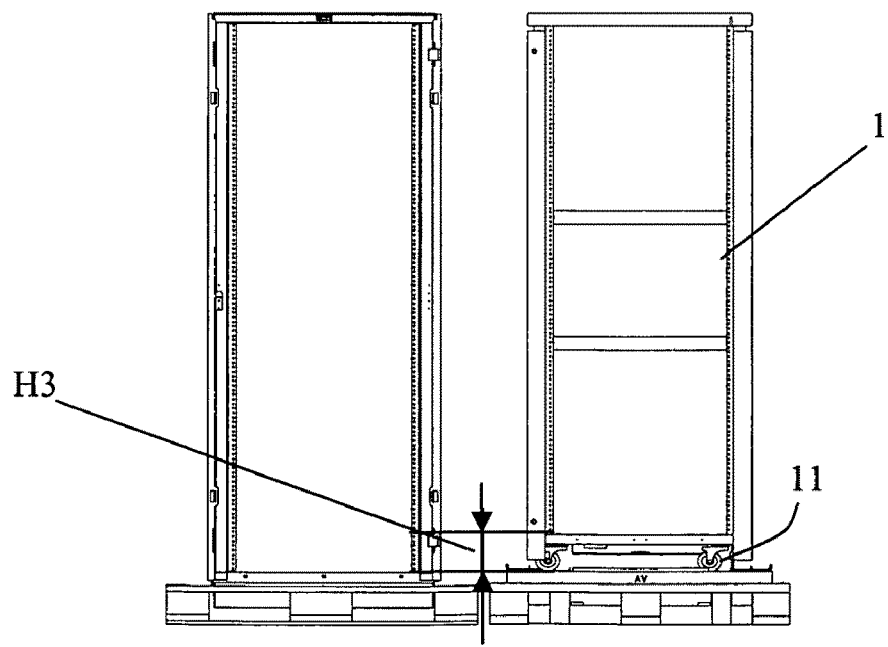
FIG. 5 represents a layout according to the invention positioned on the left of the figure and compared with a known layout positioned on the right of the figure.

As illustrated in FIG. 2, the top of the pallet (2) is then spaced away from the lower face (10) of the computer rack (1) by a second determined distance (H2) which is strictly smaller than said first determined distance (H1). In other words, by thus palletizing the computer rack without using the casters (31) between the transport pallet (2) and the rack (1), a gain in useful height may be obtained, the extra height related to the casters being suppressed. It is then understood that the invention provides a gain in height (H3) which may be transferred to the actual rack, as illustrated in FIG. 5.

Figure 4:
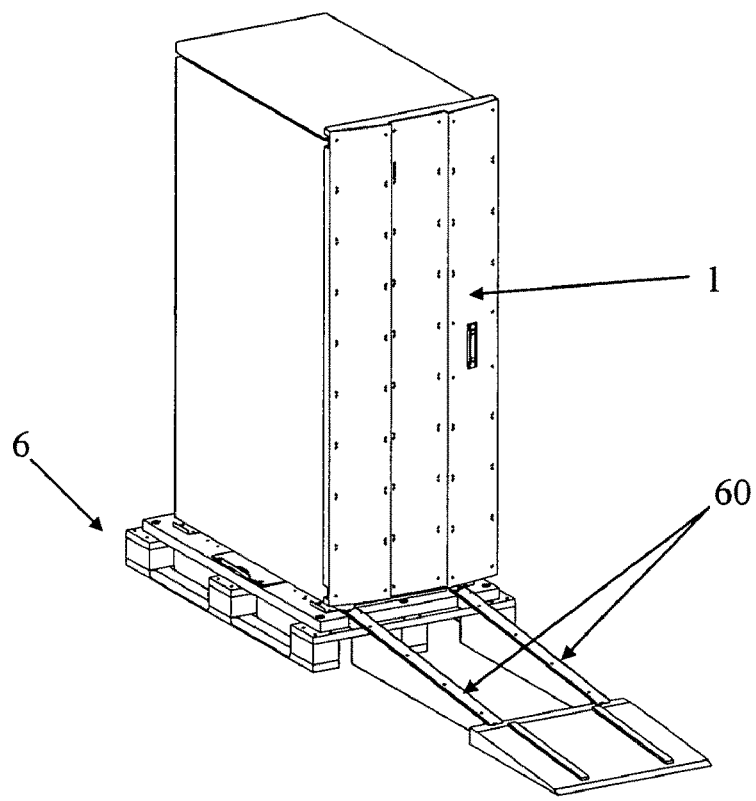
FIG. 4 shows a perspective view of a palletized rack of the prior art with its depalletization ramps.

Unlike the known methods corresponding to FIG. 4, in which the computer rack (1) should be brought via its casters onto the upper plate of the pallet (6) through a loading ramp (60) either integral with or added to the pallet (6), the solution according to the invention instead proposes that the rack be superimposed to the pallet by displacement of the pallet, along the direction of the arrows illustrated in FIG. 1. The palletization step actually includes a horizontal translation for positioning said pallet under the computer rack. This translation may further be performed parallel to the median plane (P1). The palletization step is accompanied by an attachment step performed during the horizontal translation, a first (21) of the side modules of the pallet (2) being attached to a first of the anchoring means (12) and a second (22) of the side modules of the pallet being attached to a second of the anchoring means (12).

Figure 7:
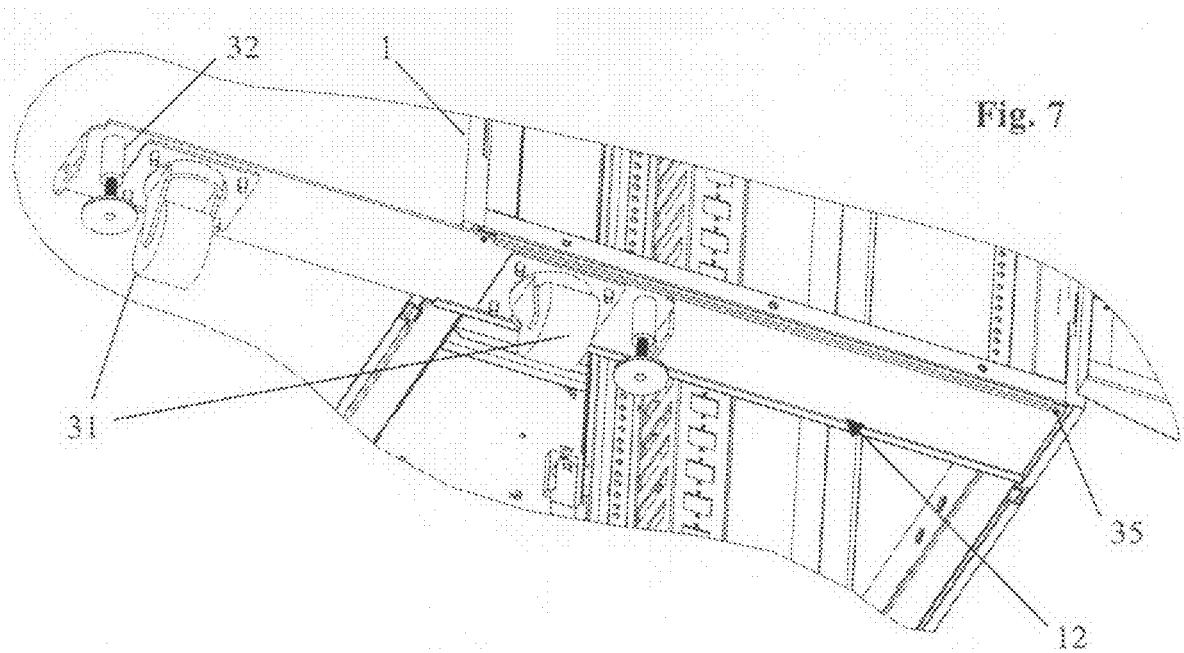
FIG. 7 represents a detail of the underside of the rack according to the invention.

In the embodiment of FIGS. 2 and 7, both anchoring means (12) comprise respective parallel slides both adapted for interchangeably receiving removable devices (3) with casters (31) and removable attachment means (210, 220, 23) of the transport pallet (2). These slides positioned substantially horizontally, allow the spacing under the computer rack (1) to be minimized since the removable devices (3) with casters (31) may be separated from the rack (1). The casters may alternatively be added to the rack (1) by an equivalent attachment method, for example by screws, a rivet, clips or any other removable attachment means. In other embodiments of the invention, the casters (31) may be of the retractable type or may be moved back into a housing of the rack (1), in a housing of the pallet (2), respectively. These embodiments each allow the gap between rack and pallet to be reduced to a distance (H2) clearly smaller than the diameter of the casters (31) usually used for supporting the rack (which may attain 1.2 metric tons).

While these casters have a diameter larger than 8 cm and that the distance (H1, FIG. 3A) corresponding to the height dimension of its casters is of the order of 17 cm, the distance (H2) between rack and pallet is for example between 0.4 and 4 cm according to the present invention.

Figures 3A, 3B:
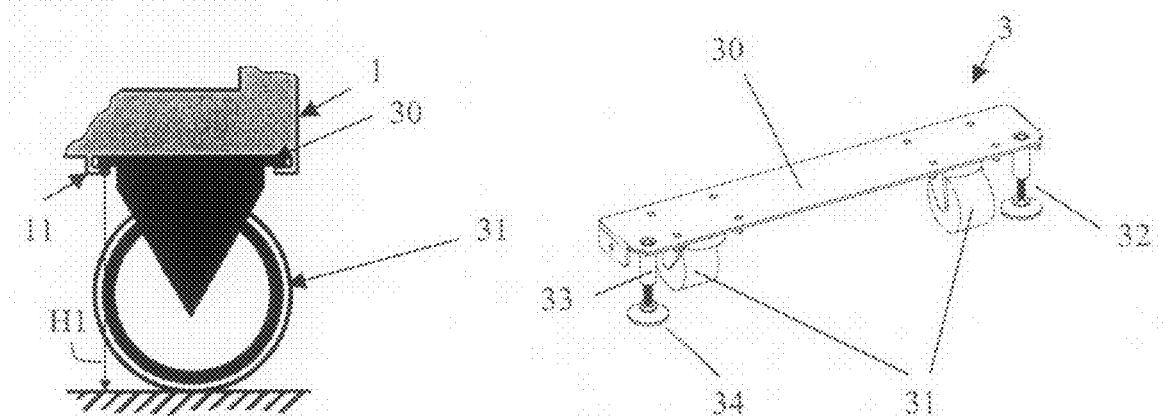
FIG. 3A represents a side view of a removable caster device associated with the computer rack and FIG. 3B shows a perspective view of this same removable device with casters.

As shown in FIGS. 3A, 3B and 7, each removable device (3) with casters (31) is provided with a cooperative member (30) provided for its attachment to one of the anchoring means (12) of the computer rack (1). With reference to FIG. 2, the rack has two sets of identical guiding rails (11) on its low structure or lower face (10). These horizontal rails (11) form slides allowing reception of any item by translation, which has a system provided for this purpose: a plate with casters (31) and jacks (32) or a pallet with a plate (for example in steel). In an embodiment of the invention, the slides consist of two sets of horizontal guiding rails (11) connected to the lower face (10) of the computer rack (1), the first set of rails being positioned at a front end (101) of the computer rack (1) and the second set of rails being positioned at a rear end (102) of this rack (1). The slides each comprise at least one housing delimited by the rails (11) and the lower face (10) of the computer rack (1) in order to translationally receive the corresponding attachment means provided on the removable caster device (3) or on the side modules (21, 22) of the pallet (2).

The plate(s) forming the cooperative member (30) may first of all be slid into the guiding rails (11) until they are in position. In the embodiment of FIG. 7, the position may be defined by the presence of a mechanical stop at the end of travel. The stop member (35) may be provided on the low structure of the computer rack (1), associated with each of the slides in order to mark an end of travel of the attachment means received in the slide.

Figure 6:
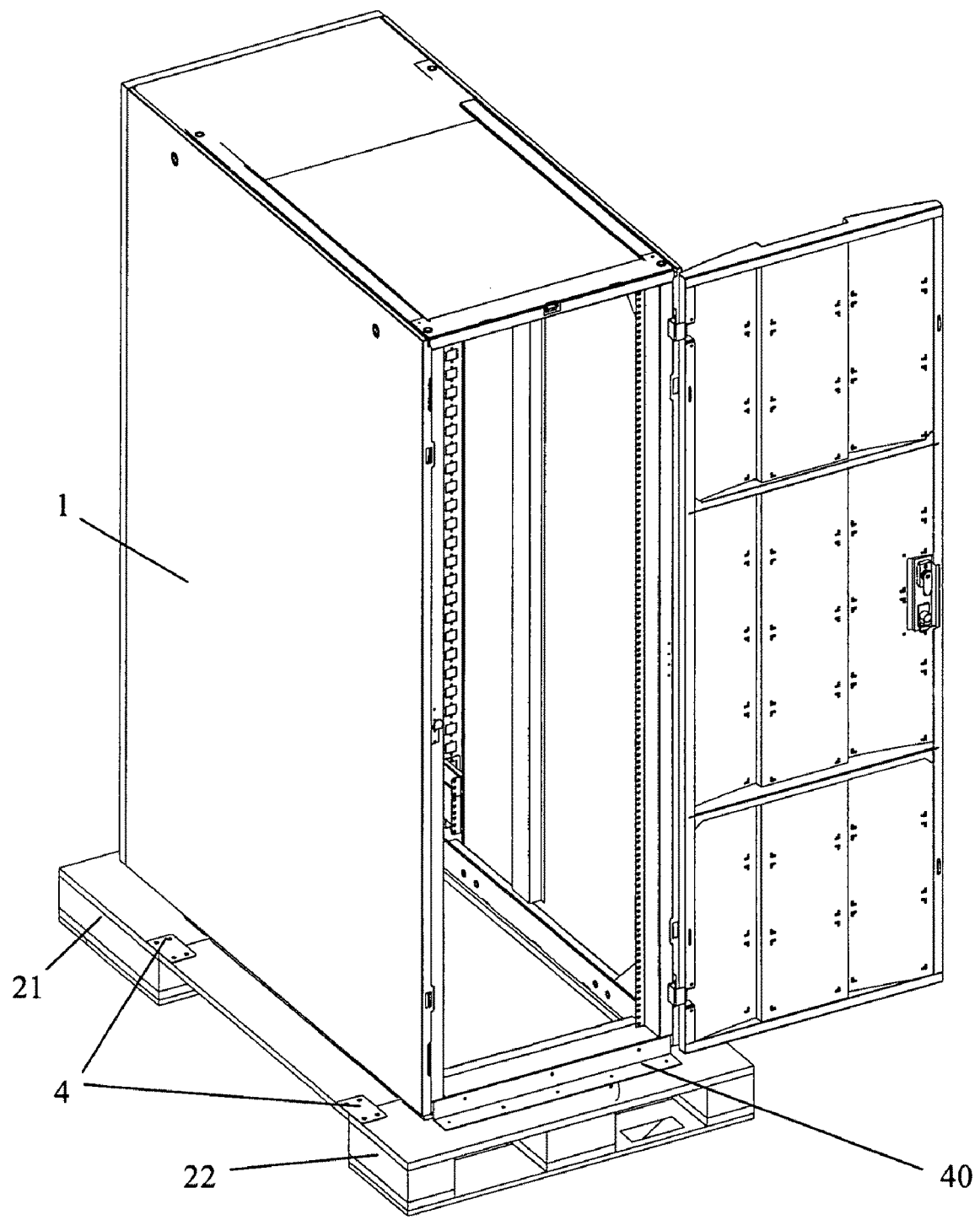
FIG. 6 shows a perspective view of a rack according to the invention physically connected to the pallet with separable modules of the invention.

With reference to FIG. 6, the pallet (2) may then be connected complementarily to the rack (1), for example by a mechanical connection system which may be dismantled. After positioning the attachment means of the side modules (21, 22) up to the stop member (35), with this mechanical connection, it is possible to suppress the last degree of freedom between the rack (1) and the pallet (2). More generally, the pallet (2) may include means (40) for locking the rack (1) in position, distributed over each of the side modules (21, 22). The mechanical rack/pallet connection is for example provided by a screwed corner system, or right angle bracket. This system may be provided both in the rear and in the front of the computer rack (1), only the front being illustrated, the rearward connection being of like kind.

In the embodiment of FIGS. 1 and 2, the pallet (2) includes a substantially horizontal top and the side modules (21, 22) may each be related to a standard pallet portion (upper floor, contact plate, sole . . . ) except for one detail: each of the side modules (21, 22) have at least one steel plate (210,220) attached on the upper flooring. It is this steel plate which performs the translation in the rails (11) of the rack (1) thereby forming a sliding connection between the latter and the pallet (2). Associating the plate (210, 220) with the pallet (2) advantageously provides some rapidity and safety during depalletization. Additionally, the removable devices (3) with casters may be provided with a cooperative member (30) with the same type of plate as the side modules. Thus, with a plate for example consisting of steel plate, setting up of the caster devices (3) is very fast, each device (3) being brought back to the rack by sliding the plate in the guiding rails (11). Of course, any other translationally sliding member may be provided on the side modules (21,22) in order to cooperate mechanically with a corresponding means mounted under the computer rack (1), so as to make the computer rack integral with the pallet (2).

As illustrated in FIG. 2, both side modules (21, 22) each comprise an upper surface fitted with at least one higher plate (210, 220) and parallel to said upper surface, a plate under which grooves or channels (23) are formed adjacent to said upper surface so as to receive the end of a rail (11) of the slides.

On the top of the pallet formed by the respective upper faces of the pieces of the pallet (2), in addition to the plates (210, 220), at least one bracket (200) is formed on the upper face of the intermediate supporting means (20). The presence of brackets (200) provides support for the lower face (10) of the computer rack (1). The connection floor formed by the intermediate supporting means (20) may consist in a plank and two brackets (200). This connection floor or analogous intermediate support is then mechanically connected to both side modules (21, 22) by a system which may be dismantled. As illustrated in FIG. 1, it should be well understood that the structure of the rack (1) is directly placed on the metal base (plate) and the brackets (200) of the pallet (2). As shown in FIG. 2, the plates (210, 220) of the side modules (21, 22) are in direct contact with the lower face (10) of the computer rack (1). There are no longer any casters (31) between the top of the pallet (2) and the underside of the rack (1), providing a gain in useful height. With the proposed arrangement according to the invention, it is therefore possible to transport a rack having a height (H) of the order of 1.80 m (40U) on its pallet (2) as far as into the room where it will be unpacked and commissioned.

The packaging method according to the invention will now be described with reference to FIGS. 1, 2 and 8.

The method first comprises a palletization step for positioning the whole of the pallet (2) under the computer rack (1), during which an attachment step is performed between the side modules of the pallet (2) and the anchoring means (12) of the computer rack (1). A complementary attachment may be performed as shown in FIG. 6, for stabilizing the rack (1) on the pallet (2). An obstacle which appears after palletization is that it becomes difficult to support the palletized rack with common lifting means and to replace the pallet (2) with the casters (31).

In order to overcome this obstacle, the method provides the use of the pallet consisting of separable pieces. The intermediate supporting means (20) may be of a smaller thickness (e1) relatively to the thickness (e2) of the side modules (21, 22), as illustrated in FIG. 2, so as to leave a gap (E) between the lower level of the pallet (2) and the lower portion of the intermediate supporting means (20). This gap (E) may facilitate separation of the intermediate supporting means (20) relatively to the remainder of the pallet (2). With reference to FIG. 8, the method thereby includes a step (51) for removing the intermediate supporting means (20), during which the respective side modules (210, 22) are detached from this intermediate supporting means (20). A substantially horizontal translational displacement of the intermediate supporting means (20) is then performed so as to leave an empty space between the side modules (21, 22). This then allows a transpallet to be introduced between both of the side modules (21, 22) so as to make lifting of the rack (1) and removal of the remainder of the pallet, independent. This type of procedure which uses a lifting truck (transpallet) or an analogous lifting means enables the number of operators to be limited to a single person.

Figure 8:
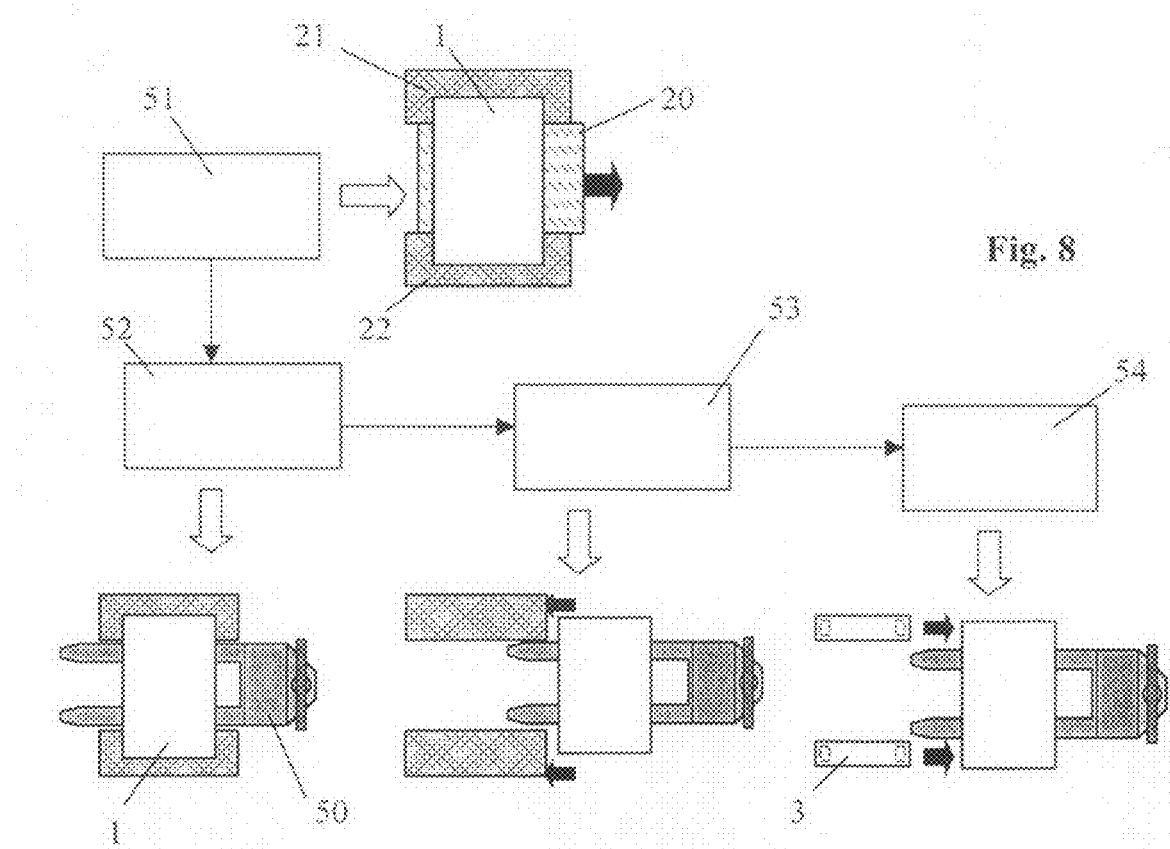
FIG. 8 illustrates the succession of performed steps according to the invention during a depalletization phase of the computer rack.

As illustrated in FIG. 8, the step (51) for removing the intermediate supporting means (20) is therefore followed by a step (52) for lifting the assembly formed by the computer rack (1) and the remainder (21, 22) of the pallet still attached to this rack (1). During this step (52), the lifting truck is for example slid from the side between the front of the rack and the rear of the rack, the side modules (21, 22) being positioned transversely relatively to the length of the computer rack (1). Thus, the centre of gravity of the rack (1) is above the lifting truck: the rack is in stable equilibrium. There follows a step (53) for removing the respective side modules (21, 22) by horizontal translation in order to replace them, during a following step (54), with removable devices (3) with casters (31). The insertion of the devices (3) may be performed along with a horizontal translation movement. The casters (31) are thus added in place of both side modules (21, 22) of the pallet (2). Depalletization is thereby completed, the rack provided with its casters (31) being laid down again onto the ground by the lifting truck.

With reference to FIG. 3B, the removable caster devices (3) may each be provided with at least two casters (31) and with at least two vertically adjustable ground-positioning jacks (32). The jacks include a base (34) in contact with the ground and a height adjusting means (33) for the base, height adjustment being performed by screwing/unscrewing for example.

One of the advantages of the invention is to provide a packaging layout with which the useful height of a computer rack may be increased while facilitating transport operations under doors with a standard height (2 m), the layout is further designed in an original way in order to facilitate depalletization with placing of the rack provided with its casters on the ground.

It should be obvious for one skilled in the art that the present invention allows embodiments under many other specific forms without departing from the field of application of the invention as claimed, the invention should not be limited to the details given above.

What is claimed:

1. A layout for packaging a computer rack, of the type transportable by a lifting device (50), comprising a transport pallet (2) and a computer rack (1) of the type capable of being supported on casters (31) extending vertically by a first determined distance (H1) relative to at least one lower face (10) of the computer rack (1), characterized in that the computer rack (1) is adapted to be anchored to the transport pallet (2) by a first and a second anchoring means (12), distributed under a lower face (10) of the computer rack, on either side of a vertical median plane (P1), said pallet (2) including first and second side modules (21, 22) and at least one intermediate supporting means (20) for connecting the side modules, said intermediate supporting means being separable from a remainder of the pallet, the first side module (21) of the pallet including first attachment means (210, 23) for removable attachment to the first anchoring means and the second (22) side module of the pallet including second attachment means (220, 23) for removable attachment to the second anchoring means, the first and second attachment means (210, 220, 23) of the first and second side modules (21, 22), respectively, and said first and second anchoring means (12) being laid out facing each other so as to maintain the lower face (10) of the computer rack (1) in the horizontal position, with a top of the pallet (2) being spaced away from the lower face (10) of the computer rack by a second determined distance (H2) strictly smaller than said first determined distance (H1).

2. The layout according to claim 1, including at least a first and a second removable device (3), each having casters (31) and each having a cooperative member (30) for attachment respectively to the first and the second anchoring means (12) of the computer rack (1).

3. The layout according to claim 1, wherein the anchoring means (12) is disposed under the computer rack (1) and comprise respective slides, the slides including horizontal rails (11), both of the side modules (21, 22) each having at least one plate (210,22) with an upper surface parallel to said plate and channels (23) adjacent to said upper surface in order to receive the end of a rail (11) of the slides.

4. The layout according to claim 3, wherein the at least one plate (210, 220) of each of the side modules (21, 22) is in direct contact with a lower face (10) of the computer rack (1).

5. The layout according to claim 1, wherein the first and the second anchoring means each (12) comprise parallel slides adapted to interchangeably receive one of the side modules (21, 22) of the transport pallet (2) or removable devices (3) with casters (31).

6. The layout according to claim 2, wherein the first and the second removable devices (3) with casters each have at least two casters (31) and at least two vertically adjustable ground-positioning jacks (32).

7. The layout according to claim 1, wherein the intermediate supporting means (20) and the first and the second side modules (21, 22) of the pallet (2) include an upper horizontal face forming a top of the pallet (2), said intermediate supporting means (20) further including at least one bracket (200) on an upper face of the computer rack for supporting said lower face (10) of the computer rack (1).

8. The layout according to claim 1, wherein the second determined distance (H2) is between 0.4 and 4 cm.

9. The layout according to claim 1, wherein the pallet includes means (40) for locking the rack (1) in position, said means being distributed over each of the side modules (21, 22).

10. The layout according to claim 1, wherein said intermediate supporting means (20) is of a smaller thickness (e1) relative to a thickness (e2) of the side modules (21, 22) so as to leave a gap (E) between a lowest level of the pallet (2) and a lower portion of the intermediate supporting means (20), said gap (E) facilitating separation of the intermediate supporting means (20) from the remainder of the pallet.

* * * * *

UNITED STATES PATENT AND TRADEMARK OFFICE
CERTIFICATE OF CORRECTION

PATENT NO.        : 7,699,180 B2                                Page 1 of 1
APPLICATION NO.   : 12/068304
DATED             : April 20, 2010
INVENTOR(S)       : Emmanuel Mollard et al.

It is certified that error appears in the above-identified patent and that said Letters Patent is hereby corrected as shown below:

Title Page, after Item (22)

Insert the following:

--(30) Foreign Application Priority Data

March 11, 2005 (FR) ........................05 02428--

Signed and Sealed this
Twenty-first Day of June, 2011

David J. Kappos
*Director of the United States Patent and Trademark Office*